United States Patent
Sugimoto

(10) Patent No.: US 12,156,414 B2
(45) Date of Patent: Nov. 26, 2024

(54) CONDUCTIVE FILM AND PRODUCTION METHOD THEREOF, ELECTRODE, AND SOLAR CELL

(71) Applicant: ZEON CORPORATION, Tokyo (JP)

(72) Inventor: Takumi Sugimoto, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 724 days.

(21) Appl. No.: 17/424,497

(22) PCT Filed: Jan. 14, 2020

(86) PCT No.: PCT/JP2020/000860
§ 371 (c)(1),
(2) Date: Jul. 21, 2021

(87) PCT Pub. No.: WO2020/158370
PCT Pub. Date: Aug. 6, 2020

(65) Prior Publication Data
US 2022/0085311 A1   Mar. 17, 2022

(30) Foreign Application Priority Data
Feb. 1, 2019  (JP) ................ 2019-017430

(51) Int. Cl.
*H10K 30/82* (2023.01)
*H01B 1/24* (2006.01)
*H01B 13/00* (2006.01)

(52) U.S. Cl.
CPC ............ *H10K 30/821* (2023.02); *H01B 1/24* (2013.01); *H01B 13/0036* (2013.01)

(58) Field of Classification Search
CPC ... B01J 21/18; B01J 23/04; B01J 37/06; B01J 1/24; B01J 13/0036; H10K 30/821; H01B 1/24; H01B 13/0036
USPC ............. 502/101, 182, 184; 252/511, 512; 429/523
See application file for complete search history.

(56) References Cited

U.S. PATENT DOCUMENTS

| | | | | |
|---|---|---|---|---|
| 6,057,057 A | * | 5/2000 | Yano | H01M 4/32 429/223 |
| 2008/0318049 A1 | | 12/2008 | Hata et al. | |
| 2011/0253668 A1 | | 10/2011 | Winoto et al. | |
| 2015/0203722 A1 | | 7/2015 | Yoshida | |
| 2015/0228982 A1 | * | 8/2015 | Shibano | H01G 11/06 252/511 |
| 2016/0133392 A1 | | 5/2016 | Sato et al. | |
| 2017/0115778 A1 | * | 4/2017 | Kanna | B32B 27/08 |

FOREIGN PATENT DOCUMENTS

| | | | | |
|---|---|---|---|---|
| CA | 2034790 A1 | * | 7/1991 | .......... G03G 5/043 |
| CN | 203377110 U | * | 1/2014 | .......... Y02E 10/542 |
| EP | 2634778 A1 | * | 9/2013 | .......... C08J 7/045 |
| JP | 3043048 B2 | * | 5/2000 | .......... H01M 10/05 |
| JP | H04-171676 A | * | 5/2000 | .......... H01M 10/05 |
| JP | 2004235539 A | * | 8/2004 | .......... C08F 232/08 |
| JP | 2013525946 A | | 6/2013 | |
| JP | 2014049631 A | | 3/2014 | |
| JP | 2014207116 A | | 10/2014 | |
| JP | 2015046583 A | | 3/2015 | |
| JP | 2015146229 A | | 8/2015 | |
| JP | 2016009737 A | | 1/2016 | |
| WO | 2006011655 A1 | | 2/2006 | |
| WO | 2013062088 A1 | | 5/2013 | |
| WO | WO-2016009980 A1 | * | 1/2016 | .......... B32B 27/08 |

OTHER PUBLICATIONS

Apr. 14, 2020, International Search Report issued in the International Patent Application No. PCT/JP2020/000860.
Jul. 27, 2021, International Preliminary Report on Patentability issued in the International Patent Application No. PCT/JP2020/000860.
Sep. 2, 2022, the Extended European Search Report issued by the European Patent Office in the corresponding European Patent Application No. 20749073.1.

* cited by examiner

*Primary Examiner* — Patricia L. Hailey
(74) *Attorney, Agent, or Firm* — KENJA IP LAW PC

(57) ABSTRACT

A conductive film contains a carbon material, a polymeric compound, and alkali metal atoms. The content of the polymeric compound is not less than 5 mass % and not more than 40 mass %, and the content of the alkali metal atoms is not less than 5.0 mass % and not more than 15.0 mass %.

11 Claims, No Drawings

CONDUCTIVE FILM AND PRODUCTION METHOD THEREOF, ELECTRODE, AND SOLAR CELL

TECHNICAL FIELD

The present disclosure relates to a conductive film and production method thereof, an electrode, and a solar cell, and, in particular, relates to a conductive film and production method thereof, an electrode including the conductive film, and a solar cell including the electrode.

BACKGROUND

Carbon nanotubes (hereinafter, also referred to as "CNTs") have been attracting interest in recent years as a carbon material having excellent electrical conductivity and mechanical characteristics. Techniques have been proposed for improving the electrical conductivity and mechanical characteristics of various products such as films through the compounding of CNTs. Specifically, in relation to conductive films used in solar cells, touch panels, and the like, for example, techniques have been proposed for improving electrical conductivity and mechanical characteristics of such conductive films through compounding of CNTs.

A conductive film that contains CNTs is typically produced by applying a carbon nanotube dispersion liquid (hereinafter, also referred to as a "CNT dispersion liquid") that contains a dispersion medium and CNTs onto a base material and then drying the CNT dispersion liquid that has been applied. Therefore, it is necessary to use a CNT dispersion liquid having CNTs well dispersed in a dispersion medium in order to enable good improvement of electrical conductivity and mechanical characteristics of a conductive film. However, CNTs have an extremely high tendency to aggregate. Therefore, a dispersant such as a polymeric dispersant is normally used to disperse CNTs in a dispersion medium during production of a CNT dispersion liquid that is to be used to form a conductive film.

However, a large amount of dispersant may remain in a conductive film that is formed using a CNT dispersion liquid containing a dispersant. Consequently, conductive films that are formed using dispersant-containing CNT dispersion liquids suffer from a problem that electrical conductivity thereof cannot be sufficiently improved due to the presence of dispersant.

In response to this problem, a technique has been proposed for producing a conductive film having excellent electrical conductivity by applying a CNT dispersion liquid containing CNTs and a dispersant onto a base material, drying the CNT dispersion liquid to form a carbon nanotube-containing film (hereinafter, also referred to as a "CNT-containing film"), and subsequently washing the CNT-containing film to remove the dispersant from the CNT-containing film (for example, refer to Patent Literature (PTL) 1).

CITATION LIST

Patent Literature

PTL 1: JP2015-146229A

SUMMARY

Technical Problem

In the conventional technique mentioned above, a dispersant is removed from a CNT-containing film through washing performed using a solvent that can dissolve the dispersant and specific dispersant decomposition treatment that are combined in a specific order. Upon producing a counter electrode using a CNT-containing film such as described above in accordance with PTL 1, producing a dye-sensitized solar cell using this electrode, and then evaluating the dye-sensitized solar cell, it has become clear that there is still room for improvement in terms of energy conversion efficiency (hereinafter, also referred to simply as "conversion efficiency") and durability.

Accordingly, one object of the present disclosure is to provide a conductive film that makes it possible to achieve a solar cell having high conversion efficiency and high durability.

Another object of the present disclosure is to provide a method of producing a conductive film that enables efficient production of the aforementioned conductive film, an electrode that includes the conductive film and makes it possible to achieve a solar cell having high conversion efficiency and high durability, and a solar cell that includes the electrode and has high conversion efficiency and high durability.

Solution to Problem

The inventor conducted diligent studies with the aim of achieving the objects set forth above. The inventor discovered that, unexpectedly, it is possible to obtain a conductive film having excellent electrical conductivity and close adherence to a base material and to achieve a solar cell having high conversion efficiency and high durability by setting the content of a polymeric compound in the conductive film and the content of alkali metal atoms in the conductive film within specific ranges, and, in this manner, the inventor completed the present disclosure.

Specifically, the present disclosure aims to advantageously solve the problem set forth above, and a presently disclosed conductive film comprises a carbon material, a polymeric compound, and alkali metal atoms, wherein content of the polymeric compound is not less than 5 mass % and not more than 40 mass %, and content of the alkali metal atoms is not less than 5.0 mass % and not more than 15.0 mass %. By setting the content of a polymeric compound in a conductive film and the content of alkali metal atoms in the conductive film within specific ranges in this manner, it is possible to obtain a conductive film that makes it possible to achieve a solar cell having high conversion efficiency and high durability.

In the presently disclosed conductive film, the carbon material preferably has a specific surface area of not less than 100 $m^2/g$ and not more than 3,000 $m^2/g$. When the specific surface area of the carbon material is not less than 100 $m^2/g$ and not more than 3,000 $m^2/g$, it is possible to increase catalytically active area and improve catalytic performance, and it is also possible to prevent excessive reduction of the solid content concentration of a carbon dispersion liquid and improve productivity when a carbon material is dispersed in a carbon dispersion liquid in production of the conductive film.

Note that the term "specific surface area" as used in the present disclosure refers to nitrogen adsorption specific surface area measured by the BET method.

In the presently disclosed conductive film, the carbon material is preferably a fibrous carbon nanostructure. When the carbon material is a fibrous carbon nanostructure, catalytic performance can be improved.

In the presently disclosed conductive film, the polymeric compound preferably includes at least one selected from the group consisting of styrene butadiene rubber, acrylonitrile butadiene rubber, acrylic rubber, and modified rubber of any thereof. When the polymeric compound is a specific rubber, it is possible to obtain a conductive film having excellent close adherence with a base material and to achieve a solar cell having high durability.

In the presently disclosed conductive film, the alkali metal atoms are preferably sodium atoms. When the alkali metal atoms are sodium atoms, catalytic performance can be improved.

Moreover, the present disclosure aims to advantageously solve the problem set forth above, and a presently disclosed electrode comprises any one of the conductive films set forth above. An electrode that includes the presently disclosed conductive film makes it possible to achieve a solar cell having high conversion efficiency and high durability.

Furthermore, the present disclosure aims to advantageously solve the problem set forth above, and a presently disclosed solar cell comprises the electrode set forth above. A solar cell that includes the presently disclosed electrode has high conversion efficiency and high durability.

Also, the present disclosure aims to advantageously solve the problem set forth above, and a presently disclosed method of producing a conductive film comprises: a step (1) of applying a carbon dispersion liquid containing a carbon material, a water-soluble dispersant, and an aqueous solvent onto a base material and drying the carbon dispersion liquid to form a carbon film; and a step (2) of washing the carbon film obtained in step (1) with an alkaline liquid to at least partially remove the water-soluble dispersant from the carbon film. The presently disclosed method of producing a conductive film enables efficient production of a conductive film that makes it possible to achieve a solar cell having high conversion efficiency and high durability.

In the presently disclosed method of producing a conductive film, the water-soluble dispersant is preferably a water-soluble polymeric dispersant. When the water-soluble dispersant is a water-soluble polymeric dispersant, it is possible to disperse the carbon material in the carbon dispersion liquid, increase the solid content concentration of the carbon dispersion liquid, and obtain a conductive film having improved close adherence with a base material.

When a polymer is referred to as "water-soluble" in the present specification, this means that when 0.5 g of the substance is dissolved in 100 g of water at 25° C., insoluble content is less than 1.0 mass %. Also note that in the case of a substance for which the solubility thereof varies depending on the pH of water, the substance is considered to be "water-soluble" so long as there is at least one pH at which the substance satisfies the definition of "water-soluble" set forth above.

In the presently disclosed method of producing a conductive film, the carbon dispersion liquid preferably further contains a binder resin. When the carbon dispersion liquid further contains a binder resin, close adherence of the conductive film and the base material can be maintained well after washing.

Note that a "binder resin" is not water-soluble and differs from a "water-soluble polymer".

In the presently disclosed method of producing a conductive film, the alkaline liquid is preferably an inorganic alkali aqueous solution. When the alkaline liquid is an inorganic alkali aqueous solution, the content of alkali metal atoms in the conductive film can be appropriately adjusted.

In the presently disclosed method of producing a conductive film, the alkaline liquid preferably has a pH of not lower than 7.5 and not higher than 9. When the pH of the alkaline liquid is not lower than 7.5 and not higher than 9, it is possible obtain the effect of washing while also inhibiting dissolution of tin-doped indium oxide (ITO) or fluorine-doped tin oxide (FTO) in the case of a base material that includes ITO or FTO, enabling reduction of resistance of the base material, and achieving a solar cell having high conversion efficiency.

Advantageous Effect

According to the present disclosure, it is possible to provide a conductive film that makes it possible to achieve a solar cell having high conversion efficiency and high durability.

Moreover, according to the present disclosure, it is possible to provide a method of producing a conductive film that enables efficient production of the aforementioned conductive film, an electrode that includes the conductive film and makes it possible to achieve a solar cell having high conversion efficiency and high durability, and a solar cell that includes the electrode and has high conversion efficiency and high durability.

DETAILED DESCRIPTION (Conductive Film)

The presently disclosed conductive film contains a carbon material, a polymeric compound, and alkali metal atoms, and may further contain any other components as necessary.

<Carbon Material>

The carbon material is not specifically limited and can be a carbon material having electrical conductivity such as fibrous carbon nanostructures, graphene, fullerenes, carbon nanohorns, graphite, activated carbon, carbon fiber, porous carbon, expanded graphite, or carbon black such as Ketjenblack or acetylene black. One of these types of carbon materials may be used individually, or two or more of these types of carbon materials may be used in combination.

Of these carbon materials, fibrous carbon nanostructures are preferable in terms of the obtained conductive film having excellent strength and catalytic performance.

The specific surface area of the carbon material is not specifically limited but is preferably 100 $m^2/g$ or more, more preferably 250 $m^2/g$ or more, and particularly preferably 500 $m^2/g$ or more, and is preferably 3,000 $m^2/g$ or less.

Catalytically active area can be increased and catalytic performance can be improved when the specific surface area of the carbon material is not less than any of the lower limits set forth above, whereas excessive reduction of the solid content concentration of a carbon dispersion liquid can be prevented and productivity can be improved when the carbon material is dispersed in a carbon dispersion liquid in production of the conductive film when the specific surface area of the carbon material is not more than the upper limit set forth above.

The content of the carbon material in the conductive film is not specifically limited but is preferably 25 mass % or more, more preferably 30 mass % or more, and particularly preferably 40 mass % or more, and is preferably 99 mass % or less, more preferably 98 mass % or less, and particularly preferably 95 mass % or less.

Resistance of the conductive film can be reduced when the content of the carbon material in the conductive film is not less than any of the lower limits set forth above, whereas close adherence of the conductive film to a base material can be maintained when the content of the carbon material in the conductive film is not more than any of the upper limits set forth above.

<<Fibrous Carbon Nanostructures>>

Specific examples of fibrous carbon nanostructures that can be used include structures in which conical structures are stacked, such as cup-stacked carbon nanotubes, circular tube-shaped carbon nanostructures such as carbon nanobuds and carbon nanotubes (CNTs), and non-circular tube-shaped carbon nanostructures such as graphene nanoribbons in which a six-membered ring network of carbon is formed in a flattened tube shape. One of these types of fibrous carbon nanostructures may be used individually, or two or more of these types of fibrous carbon nanostructures may be used in combination.

Of the examples given above, fibrous carbon nanostructures including CNTs are more preferably used as fibrous carbon nanostructures. Note that the fibrous carbon nanostructures may be composed of only CNTs. When fibrous carbon nanostructures including CNTs are used, it is possible to efficiently impart characteristics to the obtained conductive film, such as electrical conductivity, film strength, and also catalytic activity in a case in which the conductive film is used in an electrode for a solar cell, even using a small amount of the fibrous carbon nano structures.

The CNTs among the fibrous carbon nanostructures can be single-walled carbon nanotubes and/or multi-walled carbon nanotubes without any specific limitations. The CNTs are preferably carbon nanotubes having from 1 to 5 walls, and are more preferably single-walled carbon nanotubes. One of these types of carbon nanotubes may be used individually, or two or more of these types of carbon nanotubes may be used in combination. When the carbon nanotubes have fewer walls, the carbon nanotubes have a larger specific surface area and can impart characteristics to the obtained conductive film, such as catalytic activity in a case in which the conductive film is used in an electrode for a solar cell, even when a small amount of the carbon nanotubes is used.

The average diameter of the fibrous carbon nanostructures is preferably 1 nm or more, and is preferably 60 nm or less, more preferably 30 nm or less, and particularly preferably 10 nm or less. When the average diameter of the fibrous carbon nanostructures is 1 nm or more, dispersibility of the fibrous carbon nanostructures can be increased, and characteristics such as electrical conductivity can be imparted to the conductive film in a stable manner. Moreover, when the average diameter of the fibrous carbon nanostructures is 60 nm or less, characteristics can be efficiently imparted to the obtained conductive film, such as catalytic activity in a case in which the conductive film is used in an electrode for a solar cell, even when a small amount of the fibrous carbon nanostructures is used.

Note that the "average diameter of fibrous carbon nanostructures" referred to in the present disclosure can be determined by measuring the diameters (external diameters) of 20 of the fibrous carbon nanostructures, for example, in a transmission electron microscope (TEM) image, and then calculating a number-average value of the measured diameters.

The fibrous carbon nanostructures are preferably fibrous carbon nanostructures for which a ratio ($3\sigma/Av$) of a value ($3\sigma$) obtained by multiplying the diameter standard deviation ($\sigma$: sample standard deviation) by 3 relative to the average diameter (Av) is more than 0.20 and less than 0.60, more preferably fibrous carbon nanostructures for which $3\sigma/Av$ is more than 0.25, and particularly preferably fibrous carbon nanostructures for which $3\sigma/Av$ is more than 0.40. By using fibrous carbon nanostructures for which $3\sigma/Av$ is more than 0.20 and less than 0.60, the performance of the produced conductive film can be further improved.

The average diameter (Av) and the standard deviation ($\sigma$) of the fibrous carbon nanostructures may be adjusted by changing the production method and the production conditions of the fibrous carbon nanostructures, or may be adjusted by combining a plurality of types of fibrous carbon nanostructures obtained by different production methods.

The fibrous carbon nanostructures that are typically used take a normal distribution when a plot is made of diameter measured as described above on a horizontal axis and probability density on a vertical axis, and a Gaussian approximation is made.

The average length of the fibrous carbon nanostructures is preferably 10 μm or more, more preferably 50 μm or more, and particularly preferably 80 μm or more, and is preferably 600 μm or less, more preferably 500 μm or less, and particularly preferably 400 μm or less. When the average length is 10 μm or more, conduction paths can be formed in the conductive film even using a small amount of the fibrous carbon nanostructures, and the conductive film has high strength. Moreover, when the average length is 600 μm or less, wettability (coatability) during application of a carbon dispersion liquid can be improved. Therefore, setting the average length of the fibrous carbon nanostructures within any of the ranges set forth above makes it possible to sufficiently reduce the surface resistivity of the conductive film and impart high catalytic activity to the conductive film.

Note that the average length of "fibrous carbon nanostructures" referred to in the present disclosure can be determined by measuring the lengths of 20 of the fibrous carbon nanostructures, for example, in a scanning electron microscope (SEM) image, and then calculating a number-average value of the measured lengths.

The fibrous carbon nanostructures normally have an aspect ratio of more than 10. Note that the aspect ratio of fibrous carbon nanostructures can be determined by measuring the diameters and lengths of 100 randomly selected fibrous carbon nanostructures using a scanning electron microscope or a transmission electron microscope, and then calculating an average value of the ratio of diameter and length (length/diameter).

The specific surface area of the fibrous carbon nanostructures is preferably 200 $m^2/g$ or more, more preferably 400 $m^2/g$ or more, and particularly preferably 600 $m^2/g$ or more, and is preferably 2,000 $m^2/g$ or less, more preferably 1,800 $m^2/g$ or less, and particularly preferably 1,600 $m^2/g$ or less. When the specific surface area of the fibrous carbon nanostructures is 200 $m^2/g$ or more, dispersibility of the fibrous carbon nanostructures can be increased, and characteristics can be imparted to the obtained conductive film, such as electrical conductivity and also catalytic activity in a case in which the conductive film is used in an electrode for a solar cell, even when a small amount of the fibrous carbon nanostructures is used. Moreover, when the specific surface area of the fibrous carbon nanostructures is 2,000 $m^2/g$ or less, characteristics can be imparted to the obtained conductive film, such as electrical conductivity and also catalytic activity in a case in which the conductive film is used in an electrode for a solar cell, and coatability of a carbon dispersion liquid can be stabilized.

A t-plot for the fibrous carbon nanostructures obtained from an adsorption isotherm preferably exhibits a convex upward shape. Note that a "t-plot" can be obtained by, in an adsorption isotherm of the fibrous carbon nanostructures measured by the nitrogen gas adsorption method, converting the relative pressure to an average thickness t (nm) of an adsorbed layer of nitrogen gas. Specifically, an average adsorbed nitrogen gas layer thickness t corresponding to a given relative pressure is calculated from a known standard isotherm of average adsorbed nitrogen gas layer thickness t plotted against relative pressure P/P0 and the relative pressure is converted to the corresponding average adsorbed nitrogen gas layer thickness t to obtain a t-plot for the fibrous carbon nanostructures (t-plot method of de Boer et al.).

In a substance having pores at its surface, the growth of the adsorbed layer of nitrogen gas is categorized into the following processes (1) to (3). The gradient of the t-plot changes in accordance with processes (1) to (3).

(1) A process in which a single molecule adsorption layer of nitrogen molecules is formed over the entire surface (2) A process in which a multi-molecule adsorption layer is formed and is accompanied by capillary condensation filling of pores (3) A process in which a multi-molecule adsorption layer is formed at a surface that appears to be non-porous due to the pores being filled by nitrogen In a t-plot having a convex upward shape, the plot is on a straight line passing through the origin in a region in which the average adsorbed nitrogen gas layer thickness t is small, but, as t increases, the plot deviates downward from the straight line. When fibrous carbon nanostructures have a t-plot shape such as described above, this indicates that the fibrous carbon nanostructures have a large ratio of internal specific surface area relative to total specific surface area and that many openings are present in carbon nanostructures constituting the fibrous carbon nanostructures.

A bending point of the t-plot for the fibrous carbon nanostructures is preferably within a range satisfying $0.2 \leq t$ (nm)$\leq 1.5$, more preferably within a range satisfying $0.45 \leq t$ (nm)$\leq 1.5$, and particularly preferably within a range satisfying $0.55 \leq t$ (nm)$\leq 1.0$. When the bending point of the t-plot for the fibrous carbon nanostructures is within any of the ranges set forth above, dispersibility of the fibrous carbon nanostructures can be increased, and characteristics such as electrical conductivity of the conductive film can be enhanced using a small amount of the fibrous carbon nanostructures. More specifically, the fibrous carbon nanostructures aggregate more easily and have lower dispersibility when the value of the bending point is less than 0.2, whereas the fibrous carbon nanostructures become entangled with one another more easily and have lower dispersibility when the value of the bending point is more than 1.5.

The "position of the bending point" is defined as an intersection point of a linear approximation A for the above-described process (1) and a linear approximation B for the above-described process (3).

A ratio (S2/S1) of the internal specific surface area S2 of the fibrous carbon nanostructures relative to the total specific surface area S1 of the fibrous carbon nanostructures obtained from the t-plot is preferably not less than 0.05 and not more than 0.30. When the value of S2/S1 for the fibrous carbon nanostructures is within the range set forth above, dispersibility of the fibrous carbon nanostructures can be increased, and characteristics such as electrical conductivity of the conductive film can be enhanced using a small amount of the fibrous carbon nanostructures.

The total specific surface area S1 and the internal specific surface area S2 of the fibrous carbon nanostructures can be determined from the t-plot for the fibrous carbon nanostructures. Specifically, the total specific surface area S1 and external specific surface area S3 can first be determined from the gradient of the linear approximation of process (1) and the gradient of the linear approximation of process (3), respectively. The internal specific surface area S2 can then be calculated by subtracting the external specific surface area S3 from the total specific surface area S1.

Measurement of an adsorption isotherm of the fibrous carbon nanostructures, preparation of a t-plot, and calculation of the total specific surface area S1 and the internal specific surface area S2 based on t-plot analysis can be performed using a BELSORP®-mini (BELSORP is a registered trademark in Japan, other countries, or both), for example, which is a commercially available measurement apparatus produced by Bel Japan Inc.

The fibrous carbon nanostructures including CNTs that can suitably be used as the fibrous carbon nanostructures preferably have a radial breathing mode (RBM) when evaluated by Raman spectroscopy. Note that an RBM is not present in the Raman spectrum of fibrous carbon nanostructures composed of only multi-walled carbon nanotubes having three or more walls.

A ratio (G/D ratio) of G-band peak intensity relative to D-band peak intensity in a Raman spectrum for the fibrous carbon nanostructures including CNTs is preferably not less than 0.5 and not more than 10.0, and more preferably not less than 1.0 and not more than 5.0. When the G/D ratio is not less than 0.5 and not more than 10.0, characteristics can be imparted to the obtained conductive film, such as catalytic activity in a case in which the conductive film is used in an electrode for a solar cell.

In the fibrous carbon nanostructures including CNTs, the oxygen atom content relative to the total of carbon atoms and oxygen atoms according to elemental analysis by XPS is preferably 5 atom % or less, more preferably 2 atom % or less, and particularly preferably 1 atom % or less. When the oxygen atom content is within any of the preferable ranges set forth above, characteristics can be imparted well to the obtained conductive film, such as catalytic activity in a case in which the conductive film is used in an electrode for a solar cell.

The proportion constituted by carbon atoms in the fibrous carbon nanostructures including CNTs according to CHN elemental analysis is preferably 85 mass % or more, more preferably 90 mass % or more, even more preferably 95 mass % or more, and particularly preferably 98 mass % or more. Moreover, the proportion constituted by hydrogen atoms in the fibrous carbon nanostructures including CNTs according to CHN elemental analysis is preferably 1 mass % or less, more preferably 0.8 mass % or less, more preferably 0.3 mass % or less, and particularly preferably 0.1 mass % or less.

When the proportion constituted by carbon atoms (hydrogen atoms) is within any of the preferable ranges set forth above, characteristics can be imparted well to the obtained conductive film, such as catalytic activity in a case in which the conductive film is used in an electrode for a solar cell.

Note that the fibrous carbon nanostructures including CNTs can be produced by a known CNT synthesis method such as arc discharge, laser ablation, or chemical vapor deposition (CVD) without any specific limitations. Specifically, the fibrous carbon nanostructures including CNTs can be efficiently produced, for example, in accordance with a method in which during synthesis of CNTs through chemical vapor deposition (CVD) by supplying a feedstock compound and a carrier gas to a base material having a catalyst layer for carbon nanotube production at the surface thereof, catalytic activity of the catalyst layer is dramatically improved through the presence of a trace amount of an oxidant (catalyst activating material) in the system (super growth method; refer to WO2006/011655A1). Hereinafter, carbon nanotubes that are obtained by the super growth method are also referred to as "SGCNTs".

Fibrous carbon nanostructures produced by the super growth method may be composed of only SGCNTs or may include other carbon nanostructures such as non-circular tube-shaped carbon nanostructures, for example, in addition to SGCNTs.

<Polymeric Compound>

The polymeric compound is normally a compound that is derived from a water-soluble dispersant used in the subsequently described method of producing a conductive film or from a binder resin that is an optional component, but is not specifically limited thereto. Examples of the polymeric compound include melamine resins; polyvinyl resins (polyvinyl acetate, polyvinyl alcohol, polyvinyl pyrrolidone, polyvinyl acetal, etc.); polyethers (polyethylene glycol, polypropylene glycol, etc.); polyacrylic acid (sodium polyacrylate, etc.); polyester resins; cellulose and derivatives thereof; starch and modified products thereof; and other such water-soluble polymeric compounds, and also acrylic resins; polyurethane resins; polyolefin resins; polystyrene resins; butyral resins; alkyd resins; vinyl chloride resins; and styrene butadiene rubber, acrylonitrile butadiene rubber, acrylic rubber, and modified rubber of any thereof (for example, acid-modified rubber). One of these polymeric compounds may be used individually, or two or more of these polymeric compounds may be used in combination.

Of these polymeric compounds, at least one selected from the group consisting of styrene butadiene rubber, acrylonitrile butadiene rubber, acrylic rubber, and modified rubber of any thereof is preferable in terms of increasing close adherence of the conductive film and a base material.

Note that in a case in which SBR latex is used as a binder resin, for example, as described further below in the EXAMPLES section, styrene butadiene rubber remains in the conductive film as a polymeric compound.

The polymeric compound may include a hydrophilic group, and this hydrophilic group is preferably an acidic functional group ($-SO_3^-$ group, $-COO^-$ group, or $-PO_4^-$ group).

The weight-average molecular weight of the polymeric compound is preferably 1,000 or more, more preferably 2,000 or more, and particularly preferably 5,000 or more.

When the weight-average molecular weight of the polymeric compound is not less than any of the lower limits set forth above, excessive reduction of the solid content concentration of a carbon dispersion liquid can be prevented, and productivity can be improved.

Note that the weight-average molecular weight of the polymeric compound can be measured by field-flow fractionation multi-angle light scattering.

The content of the polymeric compound in the conductive film is required to be 5 mass % or more, and is preferably 10 mass % or more. Moreover, the content of the polymeric compound in the conductive film is required to be 40 mass % or less, and is preferably 30 mass % or less, and more preferably 20 mass % or less.

Close adherence of the conductive film and a base material can be maintained, resistance of the conductive film can be reduced, and a solar cell having high conversion efficiency can be achieved through the content of the polymeric compound in the conductive film being not less than any of the lower limits set forth above, whereas resistance of the conductive film can be reduced, and a solar cell having high conversion efficiency can be achieved through the content of the polymeric compound in the conductive film being not more than any of the upper limits set forth above.

Note that the content of the polymeric compound in the conductive film can be measured by a method described in the EXAMPLES section of the present specification, for example.

<Alkali Metal Atoms>

The alkali metal atoms may be sodium atoms, potassium atoms, lithium atoms, or the like without any specific limitations. One of these types of alkali metal atoms may be used individually, or two or more of these types of alkali metal atoms may be used in combination.

Of these alkali metal atoms, sodium atoms are preferable in terms of increasing catalytic performance of an electrode.

The content of the alkali metal atoms in the conductive film is required to be 5.0 mass % or more, and is preferably 5.5 mass % or more, and more preferably 6.0 mass % or more. Moreover, the content of the alkali metal atoms in the conductive film is required to be 15.0 mass % or less, and is preferably 14.5 mass % or less, and more preferably 14.0 mass % or less.

Catalytic performance can be improved through the content of the alkali metal atoms in the conductive film being not less than any of the lower limits set forth above, whereas a solar cell having high durability can be achieved through the content of the alkali metal atoms in the conductive film being not more than any of the upper limits set forth above.

Note that the content of the alkali metal atoms in the conductive film can be measured by a method described in the EXAMPLES section of the present specification, for example.

<Other Components>

Examples of other components that can be used include inorganic materials such as silica, metal particles, conductive additives, surfactants, defoamers, antioxidants, and preservatives. Commonly known components may be used as appropriate as such components. One of these other components may be used individually, or two or more of these other components may be used in combination in a freely selected ratio.

The water content of the conductive film is not specifically limited but is preferably 10 mass % or less, more preferably 5 mass % or less, and even more preferably 4 mass % or less. Note that the water content of the conductive film may be 0 mass %.

Through the water content of the conductive film being not more than any of the upper limits set forth above, it is possible to inhibit desorption of a dye and dissolution of a transparent conductive film, and to improve durability in a case in which the conductive film is used to produce a dye-sensitized solar cell, for example.

The film thickness of the conductive film is not specifically limited but is preferably 0.01 μm or more, and more preferably 0.05 μm or more, and is preferably 5 μm or less, and more preferably 3 μm or less.

Catalytic performance can be achieved through the film thickness of the conductive film being not less than any of the lower limits set forth above, whereas resistance of the conductive film can be reduced through the film thickness of the conductive film being not more than any of the upper limits set forth above.

(Production Method of Conductive Film)

The presently disclosed method of producing a conductive film includes a step (1) of applying a carbon dispersion liquid containing a carbon material, a water-soluble dispersant, and an aqueous solvent onto a base material and drying the carbon dispersion liquid to form a carbon film and a step (2) of washing the carbon film obtained in step (1) with an alkaline liquid to at least partially remove the water-soluble dispersant from the carbon film, and may further include other steps such as a step (3) of supplementing alkali metal atoms and a step (4) of drying the carbon film that has been washed with the alkaline liquid.

<Step (1)>

In step (1), a carbon dispersion liquid is applied onto a base material and is dried to form a carbon film.

<<Carbon Dispersion Liquid>>

The carbon dispersion liquid contains a carbon material, a water-soluble dispersant, and an aqueous solvent, and may further contain a binder resin and any other components as necessary.

No specific limitations are placed on the method by which the carbon dispersion liquid is produced. For example, the water-soluble dispersant may be added to a mixture of the carbon material and the aqueous solvent, or the carbon material may be added to a mixture of the water-soluble dispersant and the aqueous solvent.

Mixing treatment or dispersing treatment of the carbon dispersion liquid can be performed using a commonly known method. For example, a method using a wet jet mill such as a nanomizer or an ultimizer, a high-pressure homogenizer, an ultrasonic disperser, a ball mill, a sand grinder, a dyno-mill, a spike mill, a DCP mill, a basket mill, a paint conditioner, a high-speed stirring device such as a homo mixer, or the like may be adopted. One of these may be used individually, or two or more of these may be used in combination.

Note that the solid content concentration of the carbon dispersion liquid can be selected as appropriate depending on the application method without any specific limitations.

The pH of the carbon dispersion liquid is not specifically limited but is preferably 0.1 or higher, more preferably 0.2 or higher, and particularly preferably 0.5 or higher, and is preferably lower than 7 (i.e., acidic), more preferably 6 or lower, even more preferably 5 or lower, further preferably 4 or lower, and particularly preferably 2.5 or lower. When the pH of the carbon dispersion liquid is within any of the ranges set forth above, stability of the carbon dispersion liquid can be ensured.

Note that the pH of the carbon dispersion liquid can be lowered through addition of an acidic substance. The acidic substance is preferably sulfuric acid, hydrochloric acid, nitric acid, citric acid, oxalic acid, tartaric acid, formic acid, phosphoric acid, or the like, for example, and is more preferably hydrochloric acid or nitric acid from a viewpoint of ease of removal.

The temperature during dispersing is not specifically limited but is normally not higher than the boiling point of the aqueous solvent, preferably 60° C. or lower, and more preferably 40° C. or lower, and is preferably −10° C. or higher, and more preferably 0° C. or higher. When the temperature is within any of the ranges set forth above, the solubility/structure of the water-soluble dispersant can be controlled, dispersibility of the carbon material can be improved, and alteration of the carbon material can be inhibited even in a case in which treatment is performed in an acidic solution, for example.

[Carbon Material]

The carbon material in the carbon dispersion liquid is as previously described in description of the "conductive film" and preferable examples thereof are also as previously described.

Although no specific limitations are placed on the content of the carbon material in the carbon dispersion liquid, the content of the carbon material in the overall carbon dispersion liquid is preferably 0.001 mass % or more, more preferably 0.01 mass % or more, and particularly preferably 0.1 mass % or more, and is preferably 30.0 mass % or less, more preferably 10.0 mass % or less, even more preferably 5.0 mass % or less, and particularly preferably 1.0 mass % or less.

[Water-Soluble Dispersant]

The water-soluble dispersant may be a low molecular weight dispersant or a polymeric dispersant without any specific limitations so long as it is water-soluble, but is preferably a polymeric dispersant in terms of having excellent dispersibility of the carbon material. Examples of polymeric dispersants that can be used include melamine resins; polyvinyl resins such as polyvinyl acetate, polyvinyl alcohol, polyvinyl pyrrolidone, and polyvinyl acetal; polyethers such as polyethylene glycol and polypropylene glycol; polyacrylic acid such as sodium polyacrylate; polyester resins; cellulose and derivatives thereof; starch and modified products thereof; and salts of any of these examples. One of these polymeric dispersants may be used individually, or two or more of these polymeric dispersants may be used in combination in a freely selected ratio.

The water-soluble dispersant is a compound including at least a hydrophilic group, is preferably a polymeric compound (water-soluble polymeric dispersant) including at least a hydrophilic group, and is more preferably a polymeric compound including an acidic functional group ($-SO_3^-$ group, $-COO^-$ group, $-PO_4^-$ group, etc.). By selecting any of the preferable examples set forth above as the water-soluble dispersant, the carbon material can be dispersed in the carbon dispersion liquid, the solid content concentration of the carbon dispersion liquid can be increased, and a conductive film having improved close adherence with a base material can be obtained. Moreover, the inclusion of any of the acidic functional groups set forth above in the water-soluble dispersant makes it possible to create a difference in solubility depending on pH. Accordingly, adsorption of the water-soluble dispersant to a carbon material such as CNTs when dispersing the carbon material can be promoted by setting an acidic pH, whereas desorption of the water-soluble dispersant from the carbon material when performing washing can be promoted by setting an alkaline pH.

The weight-average molecular weight of the water-soluble dispersant is preferably 1,000 or more, more preferably 2,000 or more, and particularly preferably 5,000 or more, and is preferably 1,000,000 or less, more preferably 700,000 or less, and particularly preferably 500,000 or less.

Dispersibility can be increased through the weight-average molecular weight of the water-soluble dispersant being not less than any of the lower limits set forth above, whereas the viscosity of dispersed material can be reduced through the weight-average molecular weight of the water-soluble dispersant being not more than any of the upper limits set forth above.

Note that the weight-average molecular weight of the water-soluble dispersant can be measured by field-flow fractionation multi-angle light scattering.

The content of the water-soluble dispersant per 100 parts by mass of the carbon material is preferably 10 parts by mass or more, more preferably 50 parts by mass or more, and particularly preferably 100 parts by mass or more, and is preferably 3,000 parts by mass or less, more preferably 2,000 parts by mass or less, and particularly preferably 1,000 parts by mass or less.

The carbon material can be dispersed in the carbon dispersion liquid, the solid content concentration of the carbon dispersion liquid can be increased, and a conductive film having improved close adherence with a base material can be obtained through the content of the water-soluble dispersant being not less than any of the lower limits set forth above, whereas washing load and material cost can be reduced through the content of the water-soluble dispersant being not more than any of the upper limits set forth above.

[Aqueous Solvent]

Water may be used by itself as the aqueous solvent or a mixed solvent of water and a solvent that is miscible therewith may be used as the aqueous solvent without any specific limitations so long as the carbon material (for example, CNTs) can be dispersed therein.

By using such an aqueous solvent, environmental impact can be reduced, recovery equipment becomes unnecessary, and cost reduction is possible.

The solvent that is miscible with water may be an ether (dioxane, tetrahydrofuran, methyl cellosolve, ethylene glycol dimethyl ether, ethylene glycol butyl ether, etc.), an ether alcohol (ethoxyethanol, methoxyethoxyethanol, etc.), an ester (methyl acetate, ethyl acetate, etc.), a ketone (acetone, methyl isobutyl ketone, cyclohexanone, methyl ethyl ketone, etc.), an alcohol (methanol, ethanol, isopropanol, propylene glycol, ethylene glycol, diacetone alcohol, phenol, etc.), a lower carboxylic acid (acetic acid, etc.), an amine (triethylamine, trimethanolamine, etc.), a nitrogen-containing polar solvent (N,N-dimethylformamide, nitromethane, N-methylpyrrolidone, acetonitrile, etc.), a sulfur compound (dimethyl sulfoxide, etc.), or the like. One of these solvents may be used individually, or two or more of these solvents may be used in combination in a freely selected ratio.

Of these solvents, ethers, ketones, and alcohols are preferable as the solvent that is miscible with water from a viewpoint of improving stability of the carbon dispersion liquid.

These solvents may be subjected to degassing or the like at an appropriate timing.

[Binder Resin]

The binder resin that is an optional component is not specifically limited so long as it differs from the water-soluble polymer and is not water-soluble. Examples of binder resins that may be used include acrylic resins; polyurethane resins; polyolefin resins; polystyrene resins; butyral resins; alkyd resins; vinyl chloride resins; and particulate latexes such as styrene butadiene rubber latex (SBR latex), acrylonitrile butadiene rubber latex (NBR latex), acrylic rubber latex, and modified rubber latex of any thereof. One of these binder resins may be used individually, or two or more of these binder resins may be used in combination in a freely selected ratio.

The binder resin is preferably a binder resin that is insoluble in the alkaline liquid used in the subsequently described step (2), more preferably a post-crosslinking polymer formed of any of the resins described above (for example, a photocuring polymer (UV curing polymer), thermosetting polymer, or two-component curing polymer); or styrene butadiene rubber latex (SBR latex), acrylonitrile butadiene rubber latex (NBR latex), acrylic rubber latex, or modified rubber latex of any thereof, and particularly preferably styrene butadiene rubber latex (SBR latex), acrylonitrile butadiene rubber latex (NBR latex), acrylic rubber latex, or modified rubber latex of any thereof. By selecting any of the preferable examples set forth above as the binder resin, it is possible to obtain a conductive film that maintains close adherence with the base material even after washing in the subsequently described step (2).

Note that the term "insoluble" as used in the present specification means that "when 0.5 g of a dried product of the substance is dissolved in 100 g of the alkaline liquid used in the subsequently described step (2) at 25° C., insoluble content is 80.0 mass % or more".

The content of the binder resin per 100 parts by mass of the carbon material is preferably 0.1 parts by mass or more, more preferably 0.2 parts by mass or more, and particularly preferably 0.5 parts by mass or more, and is preferably 100 parts by mass or less, more preferably 75 parts by mass or less, and particularly preferably 50 parts by mass or less.

A conductive film that maintains close adherence with the base material even after washing in the subsequently described step (2) can be obtained through the content of the binder resin being not less than any of the lower limits set forth above, whereas resistance of the conductive film can be reduced and a solar cell having high conversion efficiency can be achieved through the content of the binder resin being not more than any of the upper limits set forth above.

[Other Components]

Other components in the carbon dispersion liquid are as previously described for other components in the conductive film.

<<Base Material>>

The base material can be selected as appropriate depending on the target application without any specific limitations on the shape, constituent material, and size (thickness, etc.) thereof so long as the carbon dispersion liquid set forth above can be applied thereon and an obtained conductive film can be held thereon.

The base material may be a base material that includes a supporting substrate and a conductive section formed on the supporting substrate, for example.

The supporting substrate is preferably glass, a polymer film, or a metal film, but is not specifically limited thereto. In a case in which the supporting substrate is a polymer film, the softening point of the polymer film is preferably 100° C. or higher.

Moreover, the base material may be a base material having a commonly known conductive film other than the presently disclosed conductive film formed as a conductive section on a supporting substrate, a base material having an undercoat layer of a resin or the like formed on a supporting substrate, or a base material having an organic/inorganic barrier layer displaying barrier properties against oxygen and/or moisture formed on a supporting substrate. Note that a sputtered film or a transparent conductive film such as ITO, FTO, or a dispersed carbon film can suitably be used as a commonly known conductive film formed on a supporting substrate in terms of reducing resistance of the base material and achieving a solar cell having high conversion efficiency.

<<Application>>

A commonly known application method can be adopted as the method by which the carbon dispersion liquid is applied onto the base material. Specific examples of application methods that can be used include dipping, roll coating, gravure coating, knife coating, air knife coating, roll knife coating, die coating, screen printing, spray coating, gravure offset, and inkjet methods.

<<Drying>>

A commonly known drying method can be adopted as the method by which the applied carbon dispersion liquid is dried. Examples of drying methods that can be used include hot-air drying, vacuum drying, hot-roll drying, and infrared irradiation. The drying temperature is normally room temperature to 200° C., but is not specifically limited thereto, and the drying time is normally 0.1 minutes to 150 minutes, but is not specifically limited thereto.

<<Carbon Film>>

The dry film thickness of the carbon film obtained through step (1) is not specifically limited but is preferably 0.01 µm or more, and more preferably 0.05 µm or more, and is preferably 5 µm or less, and more preferably 3 µm or less.

Catalytically active area can be increased and catalytic performance can be improved through the film thickness of the carbon film being not less than any of the lower limits set forth above, whereas washing efficiency in the subsequently described step (2) can be improved, resistance of a conductive film can be reduced, and a solar cell having high conversion efficiency can be achieved through the film thickness of the carbon film being not more than any of the upper limits set forth above.

In the presently disclosed method of producing a conductive film, the following step (2) is performed after step (1).

<Step (2)>

In step (2), at least the carbon film obtained in step (1) is washed with an alkaline liquid to at least partially remove the water-soluble dispersant from the carbon film.

This washing is performed with respect to the carbon film obtained through step (1), for example. In the washing, the carbon film and the alkaline liquid are brought into contact, and the water-soluble dispersant in the carbon film is caused to elute into the alkaline liquid such that some of the water-soluble dispersant that is in the carbon film is removed from the carbon film.

<<Alkaline Liquid>>

The alkaline liquid is not specifically limited so long as it is an alkaline liquid obtained by dissolving any alkaline substance in an aqueous solvent such as previously described. The alkaline liquid may, for example, be an aqueous solution of an inorganic alkali such as potassium hydroxide, sodium hydroxide, sodium carbonate, potassium carbonate, sodium hydrogen carbonate, potassium hydrogen carbonate, sodium phosphate, or potassium phosphate; or an aqueous solution of an organic alkali such as tetramethylammonium hydroxide, tetraethylammonium hydroxide, tetrabutylammonium hydroxide, monoethanolamine, diethanolamine, or triethanolamine, but is preferably an inorganic alkali aqueous solution, and more preferably sodium hydrogen carbonate ($NaHCO_3$) aqueous solution. By performing the washing using sodium hydrogen carbonate ($NaHCO_3$) aqueous solution, it is possible to create a weakly alkaline environment of approximately pH 8 and to cause less damage to a conductive film while performing washing. Moreover, by performing the washing using sodium hydrogen carbonate ($NaHCO_3$) aqueous solution, it is possible to efficiently provide sodium atoms, which are alkali metal atoms, to the obtained conductive film.

The pH of the alkaline liquid is preferably 7.5 or higher, and is preferably 9 or lower.

The effect of washing can be obtained through the pH being not lower than the lower limit set forth above, whereas dissolution of ITO or FTO can be inhibited in a case in which a base material including ITO or FTO is used, resistance of the base material can be reduced, and a solar cell having high conversion efficiency can be achieved through the pH being not higher than the upper limit set forth above.

The alkaline substance concentration of the alkaline liquid is preferably 3 mass % or more, more preferably 5 mass % or more, and particularly preferably 7 mass % or more, and is preferably 9 mass % or less.

A conductive film having improved catalytic performance can be obtained through the alkaline substance concentration of the alkaline liquid being not less than any of the lower limits set forth above, whereas dissolution of the alkaline substance in the alkaline liquid can be ensured through the alkaline substance concentration of the alkaline liquid being not more than the upper limit set forth above.

<<Washing>>

Washing of the carbon film using the alkaline liquid described above can be performed by, for example, immersing the carbon film in the alkaline liquid or applying the alkaline liquid onto the carbon film. Also note that washing of the carbon film may be split into a plurality of washes. The carbon film that has been washed can subsequently be dried by a known method (subsequently described step (4)).

The washing time of the carbon film using the alkaline liquid described above is preferably 1 minute or more, and is preferably 10 minutes or less, more preferably 5 minutes or less, and particularly preferably 3 minutes or less. The water-soluble dispersant can be sufficiently removed through the washing time being not less than the lower limit set forth above, whereas improved efficiency can be achieved due to treatment in a short time through the washing time being not more than any of the upper limits set forth above.

The temperature of the alkaline liquid during washing is not specifically limited but is preferably not lower than 10° C. and not higher than 30° C.

<Step (3)>

Since the content of alkali metal atoms (for example, sodium atoms) in the conductive film may decrease in a case in which a dilute aqueous solution of sodium hydroxide (NaOH) is used to perform washing of the carbon film in step (2), for example, step (3) may be performed so as to add an alkali metal ion-containing aqueous solution such as sodium iodide (NaI) aqueous solution and thereby supplement alkali metal atoms (for example, sodium atoms).

The supplementary alkali metal atoms are as previously described in description of the "conductive film" and preferable examples thereof are also as previously described.

The alkali metal ion-containing aqueous solution that is added may, for example, be NaI aqueous solution, NaBr aqueous solution, or the like.

The solute concentration of the alkali metal ion-containing aqueous solution that is added is preferably 1 mass % or more, more preferably 2 mass % or more, and particularly preferably 5 mass % or more, and is preferably 50 mass % or less, more preferably 40 mass % or less, and particularly preferably 30 mass % or less.

Catalytic performance of the conductive film can be efficiently increased through the solute concentration of the added alkali metal ion-containing aqueous solution being not less than any of the lower limits set forth above, whereas permeability into the conductive film can be increased through the solute concentration of the added alkali metal ion-containing aqueous solution being not more than any of the upper limits set forth above.

<Step (4)>

Drying of the carbon film that has been washed with the alkaline liquid in step (2) may be performed as step (4).

The drying conditions are not specifically limited, but drying in a low humidity environment, a heated environment, or a vacuum environment, for example, is preferable.

(Electrode)

The presently disclosed electrode is an electrode that is obtained using the presently disclosed conductive film. The presently disclosed electrode can suitably be used in an organic solar cell such as a dye-sensitized solar cell (DSC), an organic thin-film solar cell, or a perovskite solar cell, for example.

A dye-sensitized solar cell (DSC) is used as example for describing the presently disclosed electrode. A dye-sensitized solar cell (DSC) normally has a structure in which a photoelectrode, an electrolyte layer, and a counter electrode are arranged in this order.

The photoelectrode is an electrode that can release electrons to an external circuit upon receiving light. The photoelectrode normally includes a photoelectrode substrate that has a conductive film formed on a base material, a porous semiconductor fine particulate layer that is formed on the photoelectrode substrate, and a sensitizing dye layer that is formed through adsorption of a sensitizing dye at the surface of the porous semiconductor fine particulate layer.

The electrolyte layer is a layer for separating the photoelectrode and the counter electrode and for performing efficient charge transfer.

The counter electrode is an electrode for efficiently passing electrons from the external circuit to the electrolyte layer. The counter electrode normally includes a counter electrode substrate that has a conductive film formed on a base material and a catalyst layer that is formed on the counter electrode substrate.

Note that the presently disclosed conductive film may be used as the conductive film of the photoelectrode, may be used as the conductive film or the catalyst layer of the counter electrode, or may be used as the conductive film of the photoelectrode and as the conductive film or the catalyst layer of the counter electrode. Moreover, in a case in which the presently disclosed conductive film is a CNT film, the CNT film may be formed on a base material and may then be used as the counter electrode since the CNT film can function as both a conductive film and a catalyst layer.

(Solar Cell)

The presently disclosed solar cell includes the presently disclosed electrode set forth above. The presently disclosed solar cell is not specifically limited so long as it includes the presently disclosed electrode. The presently disclosed solar cell may be an organic solar cell such as the dye-sensitized solar cell (DSC) described above, an organic thin-film solar cell, or a perovskite solar cell. Examples of perovskite solar cells include those described in JP2014-049631A, JP2015-046583A, JP2016-009737A, and so forth. Other examples besides these organic solar cells include crystalline silicon solar cells such as monocrystalline silicon solar cells, polycrystalline silicon solar cells, microcrystalline silicon solar cells, and multi-junction silicon solar cells; amorphous silicon solar cells; compound solar cells such as GaAs solar cells, CIS solar cells, and CdTe solar cells; and the like that are categorized based on the type of semiconductor substrate.

Moreover, the presently disclosed solar cell is not limited to using sunlight as a light source and may, for example, use room lighting as a light source.

The presently disclosed solar cell has high conversion efficiency as a result of including the presently disclosed electrode. The presently disclosed solar cell is preferably used as a portable solar cell or an indoor solar cell in order to particularly exploit such characteristics thereof.

EXAMPLES

The following provides a more specific description of the present disclosure based on examples. However, the present disclosure is not limited to the following examples. It should be noted that although the presently disclosed conductive film is used to form a catalyst electrode (counter electrode) in these examples, the presently disclosed conductive film may be used to form a photoelectrode.

The cell performance of dye-sensitized solar cell elements produced in the examples and comparative examples were evaluated by the following methods. Moreover, water content measurement, polymeric compound content (residual amount) measurement, alkali metal atom content measurement, and peeling testing were performed with respect to a conductive film of an FTO glass substrate produced in each example or comparative example.

<Cell Performance>

A solar simulator (PEC-L11 produced by Peccell Technologies Inc.) in which an AM1.5G filter was attached to a 150 W xenon lamp light source was used as a light source. The light intensity was adjusted to 1 sun (AM1.5G, 100 mW/cm$^2$ [Class A of HS C8912]). A produced dye-sensitized solar cell element was connected to a sourcemeter (Series 2400 SourceMeter produced by Keithley Instruments) and the following current/voltage characteristic was measured.

Output current was measured while changing bias voltage from 0 V to 0.8 V in 0.01 V units under 1 sun light-irradiation. The output current was measured for each voltage step by, after the voltage had been changed, integrating values from 0.05 seconds after the voltage change to 0.15 seconds after the voltage change. Measurement was also performed while changing the bias voltage in the reverse direction from 0.8 V to 0 V, and an average value of measurements for the forward direction and the reverse direction was taken to be the photoelectric current.

Note that in this measurement, a black light-shielding mask having a hollowed out section that was a circle of 5.5 mm in diameter was used in order to define the effective area of the dye-sensitized solar cell element. By placing this mask on the photoelectrode of the produced dye-sensitized solar cell element, the effective area was set as 0.2376 cm$^2$.

Measurement results of the current/voltage characteristic described above were used to calculate the fill factor and the energy conversion efficiency (%), which were evaluated by the following standards. The results are shown in Table 1.

In addition, the produced dye-sensitized solar cell element was stored in an environment having a temperature of 60° C. for 500 hours, and the cell performance described above (energy conversion efficiency (%)) was measured and calculated once again after this storage. A ratio thereof relative to the initial characteristic was calculated and was evaluated by the evaluation standard shown below (durability evaluation). The results are shown in Table 1.

<<Fill Factor>>

A: 0.5 or more
B: Not less than 0.4 and less than 0.5
C: Not less than 0.35 and less than 0.4
D: Not less than 0.3 and less than 0.35
E: Less than 0.3

<<Energy Conversion Efficiency>>

A: 5% or more
B: Not less than 4% and less than 5%
C: Not less than 3% and less than 4%
D: Not less than 2% and less than 3%
E: Less than 2%

<<Durability Evaluation>>

A: 85% or more
B: Not less 80% and less than 85%
C: Not less than 75% and less than 80%
D: Not less 70% and less than 75%

E: Less than 70%

<Water Content Measurement of Conductive Film>

A commercially available automatic water meter (Karl Fischer water meter produced by Mitsubishi Chemical Analytech Co., Ltd.) was used to measure the water content of a conductive film formed on an FTO glass substrate produced in each example and the water content of a conductive film formed on a substrate formed of an ITO-PEN film produced in each comparative example. The results are shown in Table 1.

<Polymeric Compound Content Measurement of Conductive Film>

A thermogravimetric analyzer (produced by Rigaku Corporation; product name: TG-DTA) was used to measure the polymeric compound content of a conductive film formed on an FTO glass substrate produced in each example and the polymeric compound content of a conductive film formed on a substrate formed of an ITO-PEN film produced in each comparative example by thermogravimetric analysis. The results are shown in Table 1.

<Alkali Metal Atom Content Measurement of Conductive Film>

An inductively coupled plasma mass spectrometer (ICPMS) was used to measure the alkali metal atom content of a conductive film formed on an FTO glass substrate produced in each example and the alkali metal atom content of a conductive film formed on a substrate formed of an ITO-PEN film produced in each comparative example. The results are shown in Table 1.

<Peeling Testing of Conductive Film>

For each FTO glass substrate having a conductive film formed thereon that was produced in an example and for each substrate formed of an ITO-PEN film having a conductive film formed thereon that was produced in a comparative example, the substrate was dipped into pure water in a vertical manner so as to confirm the presence or absence of peeling through the occurrence or lack of dislocation. Note that lack of dislocation indicates that close adherence between the conductive film and the substrate is maintained, and thus that the resistance of the conductive film can be reduced and a solar cell having high conversion efficiency can be achieved.

Example 1

<Synthesis of Carbon Nanotubes>

SGCNTs were obtained by the super growth method in accordance with WO2006/011655A1.

The obtained SGCNTs had a BET specific surface area of 1,000 $m^2$/g, a mass density of 0.03 g/$cm^3$, and a micropore volume of 0.44 mL/g. Based on results of measuring the diameters of 100 randomly selected SGCNTs using a transmission electron microscope, the average diameter (Av) was 3.3 nm, a value (3σ) obtained by multiplying the diameter sample standard deviation (σ) by 3 was 1.9 nm, 3σ/Av was 0.58, and the average length was 100 μm. The obtained SGCNTs were composed of mainly single-walled CNTs.

<Production of Catalyst Electrode for Dye-Sensitized Solar Cell>

After weighing 0.005 g (100 parts by mass) of the carbon nanotubes (CNTs), 0.025 g (500 parts by mass) of a sodium salt of polyacrylic acid (molecular weight: 25,000; produced by Wako Pure Chemical Industries, Ltd.; product name: Sodium polyacrylate) as a water-soluble dispersant, and 0.001 g (20 parts by mass) of styrene butadiene rubber latex (SBR latex; produced by Zeon Corporation; product name: BM-451B) as a binder resin into a sample bottle having a capacity of 50 mL, and adding 30 g of pure water, nitric acid was used to adjust the pH to 2. The contents of the sample bottle were then treated in a bath-type ultrasonic disperser for 30 minutes to obtain a carbon nanotube dispersion liquid.

Next, 500 μL of the carbon nanotube dispersion liquid was dripped onto an FTO glass substrate that had been cut to 2 cm×1.2 cm and was dried at 60° C. to form a CNT-containing film (dry film thickness: 0.1 μm) on the FTO glass substrate (step (1)).

The FTO glass substrate on which the CNT-containing film had been formed was immersed in $NaHCO_3$ aqueous solution (pH 8) having an alkaline substance concentration of 9 mass % for 5 minutes (step (2)), and then the CNT-containing film was left at rest in an environment having a dew point of −50° C. for 8 hours so as to dry the CNT-containing film and thereby obtain an FTO glass substrate having the CNT-containing film as a catalyst layer at the surface thereof (i.e., obtain a catalyst electrode).

<Production of Photoelectrode for Dye-Sensitized Solar Cell>

[Production of Dye Solution]

A 20 mL volumetric flask was charged with 7.2 mg of a ruthenium complex dye (N719 produced by Solaronix). Next, 10 mL of tert-butanol was added into the volumetric flask and was stirred. Thereafter, 8 mL of acetonitrile was added, the volumetric flask was stoppered, and then 60 minutes of stirring thereof was performed through vibration by an ultrasonic cleaner. The solution was held at normal temperature while acetonitrile was added to adjust the total volume to 20 mL.

[Production of Photoelectrode]

A low-temperature film formation titanium oxide paste (produced by Peccell Technologies, Inc.) was applied onto a substrate formed of an ITO-PEN film, the coating film was dried, and then 10 minutes of heating was performed at a temperature of 150° C. using a hot plate so as to produce a porous titanium oxide electrode. The titanium oxide electrode was immersed in the N719 dye solution (0.3 mM) described above. In this immersion, an amount of 2 mL or more of the dye solution per one electrode was used as a rough guide so as to ensure sufficient dye adsorption.

Dye adsorption was performed while maintaining the dye solution at 40° C. After 2 hours, the dye adsorption-treated titanium oxide electrode was removed from the petri dish, was washed with acetonitrile solution, and was dried to obtain a photoelectrode.

<Production of Dye-Sensitized Solar Cell Element>

A circular shape of 9 mm in diameter was hollowed out from the inside of a thermal bonding film (produced by Solaronix) of 25 μm in thickness, and this film was set on the catalyst electrode. After performing dripping of an electrolyte solution, the photoelectrode was then overlapped from above, and both sides were clamped using covered alligator clips to thereby produce a dye-sensitized solar cell element. Cell performance was evaluated. The results are shown in Table 1.

Example 2

A catalyst electrode for a dye-sensitized solar cell, a photoelectrode for a dye-sensitized solar cell, and a dye-sensitized solar cell element were produced in the same way as in Example 1 with the exception that instead of immersing the FTO glass substrate on which the CNT-containing film had been formed in $NaHCO_3$ aqueous solution (pH 8) having an alkaline substance concentration of 9 mass % in production of the catalyst electrode for a dye-sensitized solar cell in Example 1, the FTO glass substrate on which the CNT-containing film had been formed was immersed in $NaHCO_3$ aqueous solution (pH 8) having an alkaline substance concentration of 7 mass %. Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Example 3

A catalyst electrode for a dye-sensitized solar cell, a photoelectrode for a dye-sensitized solar cell, and a dye-sensitized solar cell element were produced in the same way as in Example 1 with the exception that instead of using 0.001 g (20 parts by mass) of styrene butadiene rubber latex (SBR latex) as a binder resin in production of the catalyst electrode for a dye-sensitized solar cell in Example 1, 0.00025 g (5 parts by mass) of styrene butadiene rubber latex (SBR latex) was used as a binder resin. Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Example 4

A catalyst electrode for a dye-sensitized solar cell, a photoelectrode for a dye-sensitized solar cell, and a dye-sensitized solar cell element were produced in the same way as in Example 1 with the exception that instead of immersing the FTO glass substrate on which the CNT-containing film had been formed in $NaHCO_3$ aqueous solution (pH 8) having an alkaline substance concentration of 9 mass % for 5 minutes in production of the catalyst electrode for a dye-sensitized solar cell in Example 1, the FTO glass substrate on which the CNT-containing film had been formed was immersed in $NaHCO_3$ aqueous solution (pH 8) having an alkaline substance concentration of 9 mass % for 5 minutes and was then immersed in NaI aqueous solution having a concentration of 5 mass % for 10 minutes. Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Example 5

A catalyst electrode for a dye-sensitized solar cell, a photoelectrode for a dye-sensitized solar cell, and a dye-sensitized solar cell element were produced in the same way as in Example 1 with the exception that instead of performing 5 minutes of immersion in $NaHCO_3$ aqueous solution (pH 8) having an alkaline substance concentration of 9 mass % in production of the catalyst electrode for a dye-sensitized solar cell in Example 1, 5 minutes of immersion was performed in NaOH aqueous solution (pH 8) having an alkaline substance concentration of 0.004 mass %. Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Example 6

A catalyst electrode for a dye-sensitized solar cell, a photoelectrode for a dye-sensitized solar cell, and a dye-sensitized solar cell element were produced in the same way as in Example 1 with the exception that instead of using 0.005 g (100 parts by mass) of carbon nanotubes (CNTs) in production of the catalyst electrode for a dye-sensitized solar cell in Example 1, carbon black (produced by Lion Specialty Chemicals Co., Ltd.; product name: ECP600JD; specific surface area: 600 $m^2/g$) was used. Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Example 7

A catalyst electrode for a dye-sensitized solar cell, a photoelectrode for a dye-sensitized solar cell, and a dye-sensitized solar cell element were produced in the same way as in Example 6 with the exception that instead of using 0.025 g (500 parts by mass) of a sodium salt of polyacrylic acid as a water-soluble dispersant, using 0.001 g (20 parts by mass) of styrene butadiene rubber latex (SBR latex) as a binder resin, and immersing the FTO glass substrate on which the carbon black-containing film had been formed in $NaHCO_3$ aqueous solution (pH 8) in production of the catalyst electrode for a dye-sensitized solar cell in Example 6, 0.001 g (20 parts by mass) of a sodium salt of polyacrylic acid was used as a water-soluble dispersant, styrene butadiene rubber latex (SBR latex) was not used as a binder resin, and the FTO glass substrate on which the carbon black-containing film had been formed was not immersed in $NaHCO_3$ aqueous solution (pH 8). Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Comparative Example 1

A catalyst electrode for a dye-sensitized solar cell, a photoelectrode for a dye-sensitized solar cell, and a dye-sensitized solar cell element were produced in the same way as in Example 1 with the exception that instead of forming a CNT-containing film on an FTO glass substrate and immersing the FTO glass substrate on which the CNT-containing film had been formed in $NaHCO_3$ aqueous solution (pH 8) having an alkaline substance concentration of 9 mass % for 5 minutes in production of the catalyst electrode for a dye-sensitized solar cell in Example 1, a CNT-containing film was formed on a substrate formed of an ITO-PEN film, the substrate formed of an ITO-PEN film on which the CNT-containing film had been formed was immersed in water (pH 7) for 5 minutes, and then the conductive film (CNT-containing film) was subjected to UV treatment through irradiation with 430 $\mu W/cm^2$ of ultraviolet light for 10 minutes. Cell performance evaluation of the dye-sensitized solar cell element, water content measurement of the conductive film, polymeric compound content measurement of the conductive film, alkali metal atom content measurement of the conductive film, and peeling testing of the conductive film were also performed. The results are shown in Table 1.

Comparative Example 2

A catalyst electrode for a dye-sensitized solar cell, a photoelectrode for a dye-sensitized solar cell, and a dye-sensitized solar cell element were produced in the same way as in Example 1 with the exception that instead of forming a CNT-containing film on an FTO glass substrate and using 0.001 g (20 parts by mass) of styrene butadiene rubber latex (SBR latex) as a binder resin in production of the catalyst electrode for a dye-sensitized solar cell in Example 1, a CNT-containing film was formed on a substrate formed of an ITO-PEN film and styrene butadiene rubber latex (SBR latex) was not used as a binder resin. Water content measurement of the conductive film, polymeric compound content measurement of the conductive film, alkali metal atom content measurement of the conductive film, and peeling testing of the conductive film were also performed. The results are shown in Table 1.

TABLE 1

|  |  |  | Example 1 | Example 2 | Example 3 |
|---|---|---|---|---|---|
| Carbon dispersion liquid | Carbon material | Type | Carbon nanotubes | Carbon nanotubes | Carbon nanotubes |
|  |  | Specific surface area ($m^2/g$) | 1000 | 1000 | 1000 |
|  |  | Parts by mass | 100 | 100 | 100 |
|  | Water-soluble dispersant | Type | Sodium polyacrylate polymer | Sodium polyacrylate polymer | Sodium polyacrylate polymer |
|  |  | Parts by mass | 500 | 500 | 500 |
|  | Binder resin | Type | SBR latex | SBR latex | SBR latex |
|  |  | Parts by mass | 20 | 20 | 5 |
|  | Solvent |  | Water | Water | Water |
|  | Solid content concentration (mass %) |  | 0.1 | 0.1 | 0.1 |
| Base material | Conductive section |  | FTO | FTO | FTO |
|  | Supporting substrate |  | Glass | Glass | Glass |
| Carbon film | Dry film thickness (μm) |  | 0.1 | 0.1 | 0.1 |
| Washing method (step 2) | Washing medium | Type | $NaHCO_3$ aqueous solution | $NaHCO_3$ aqueous solution | $NaHCO_3$ aqueous solution |
|  |  | pH | 8 | 8 | 8 |
|  |  | Concentration (mass %) | 9 | 7 | 9 |
|  | Washing time (minutes) |  | 5 | 5 | 5 |
| Additional process | Drying method |  | Storage in environment having −50° C. dew point | Storage in environment having −50° C. dew point | Storage in environment having −50° C. dew point |
|  | Other |  | — | — | — |
| Conductive film | Water content (mass %) |  | 3 | 5 | 2 |
|  | Polymeric compound content (residual amount) (mass %) |  | 20 | 40 | 5 |
|  | Alkali metal atom content (mass %) |  | 7.3 | 10.0 | 7.5 |
| Evaluation | Peeling testing |  | No dislocation | No dislocation | No dislocation |
|  | Cell performance | Fill factor | A | B | B |
|  |  | Energy conversion efficiency | A | B | B |
|  |  | Durability | A | B | A |

|  |  |  | Example 4 | Example 5 | Example 6 |
|---|---|---|---|---|---|
| Carbon dispersion liquid | Carbon material | Type | Carbon nanotubes | Carbon nanotubes | Carbon black |
|  |  | Specific surface area ($m^2/g$) | 1000 | 1000 | 600 |
|  |  | Parts by mass | 100 | 100 | 100 |
|  | Water-soluble dispersant | Type | Sodium polyacrylate polymer | Sodium polyacrylate polymer | Sodium polyacrylate polymer |
|  |  | Parts by mass | 500 | 500 | 500 |
|  | Binder resin | Type | SBR latex | SBR latex | SBR latex |
|  |  | Parts by mass | 20 | 20 | 20 |
|  | Solvent |  | Water | Water | Water |
|  | Solid content concentration (mass %) |  | 0.1 | 0.1 | 0.1 |
| Base material | Conductive section |  | FTO | FTO | FTO |
|  | Supporting substrate |  | Glass | Glass | Glass |
| Carbon film | Dry film thickness (μm) |  | 0.1 | 0.1 | 0.1 |
| Washing method (step 2) | Washing medium | Type | $NaHCO_3$ aqueous solution | NaOH aqueous solution | $NaHCO_3$ aqueous solution |
|  |  | pH | 8 | 8 | 8 |
|  |  | Concentration (mass %) | 9 | 0.004 | 9 |
|  | Washing time (minutes) |  | 5 | 5 | 5 |

TABLE 1-continued

|  |  |  |  |  |  |
|---|---|---|---|---|---|
| Additional process | Drying method | | Storage in environment having −50° C. dew point | Storage in environment having −50° C. dew point | Storage in environment having −50° C. dew point |
| | Other | | Additional washing with NaI aqueous solution | — | — |
| Conductive film | Water content (mass %) | | 3 | 3 | 2 |
| | Polymeric compound content (residual amount) (mass %) | | 20 | 20 | 20 |
| | Alkali metal atom content (mass %) | | 15.0 | 5.0 | 6.0 |
| Evaluation | Peeling testing | | No dislocation | No dislocation | No dislocation |
| | Cell performance | Fill factor | A | B | B |
| | | Energy conversion efficiency | A | C | B |
| | | Durability | B | A | A |

|  |  |  | Example 7 | Comparative Example 1 | Comparative Example 2 |
|---|---|---|---|---|---|
| Carbon dispersion liquid | Carbon material | Type | Carbon black | Carbon nanotubes | Carbon nanotubes |
| | | Specific surface area (m2/g) | 600 | 1000 | 1000 |
| | | Parts by mass | 100 | 100 | 100 |
| | Water-soluble dispersant | Type | Sodium polyacrylate polymer | Sodium polyacrylate polymer | Sodium polyacrylate polymer |
| | | Parts by mass | 20 | 500 | 500 |
| | Binder resin | Type | None | SBR latex | None |
| | | Parts by mass | — | 20 | — |
| | Solvent | | Water | Water | Water |
| | Solid content concentration (mass %) | | 0.1 | 0.1 | 0.1 |
| Base material | Conductive section | | FTO | ITO | ITO |
| | Supporting substrate | | Glass | PEN | PEN |
| Carbon film | Dry film thickness (μm) | | 0.1 | 0.1 | 0.1 |
| Washing method (step 2) | Washing medium | Type | No washing | Water washing | NaHCO3 aqueous solution |
| | | pH | — | 7 | 8 |
| | | Concentration (mass %) | — | — | 9 |
| | Washing time (minutes) | | — | 5 | 5 |
| Additional process | Drying method | | Storage in environment having −50° C. dew point | Storage in environment having −50° C. dew point | Storage in environment having −50° C. dew point |
| | Other | | — | UV treatment | — |
| Conductive film | Water content (mass %) | | 7 | 10 | 2 |
| | Polymeric compound content (residual amount) (mass %) | | 20 | 60 | 0 |
| | Alkali metal atom content (mass %) | | 5.0 | 4.5 | 7.3 |
| Evaluation | Peeling testing | | No dislocation | No dislocation | Dislocation |
| | Cell performance | Fill factor | C | E | Performance cannot be evaluated |
| | | Energy conversion efficiency | C | E | |
| | | Durability | B | E | |

It can be seen from Table 1 that dye-sensitized solar cell elements having high levels for all of peeling testing, fill factor, energy conversion efficiency, and durability were obtained in Examples 1 to 7 compared to Comparative Examples 1 and 2.

In Example 2, the resistance of the conductive film increased and the fill factor and energy conversion efficiency were poor (fill factor: B; energy conversion efficiency: B) due to the influence of high polymeric compound content (residual amount) in the conductive film (Example 1: 20 mass %; Example 2: 40 mass %) and durability was poor (durability: B) due to the influence of high water content in the conductive film (Example 1: 3 mass %; Example 2: 5 mass %) as compared to Example 1 (fill factor: A; energy conversion efficiency: A; durability: A).

In Example 3, the resistance of the conductive film increased and the fill factor and energy conversion efficiency were poor (fill factor: B; energy conversion efficiency: B) due to the influence of peeling of the conductive film from the substrate (slight peeling not reaching the level of dislocation) as compared to Example 1 (fill factor: A; energy conversion efficiency: A; durability: A).

In Example 4, durability was poor (durability: B) due to the influence of high alkali metal atom content in the conductive film (Example 1: 7.3 mass %; Example 4: 15.0 mass %) as compared to Example 1 (fill factor: A; energy conversion efficiency: A; durability: A).

In Example 5, the catalytic performance of the conductive film decreased and the fill factor was poor (fill factor: B) due to the influence of low alkali metal atom content in the conductive film (Example 1: 7.3 mass %; Example 5: 5.0 mass %) as compared to Example 1 (fill factor: A; energy conversion efficiency: A; durability: A).

In Example 6, the catalytic performance of the conductive film decreased and the fill factor was poor (fill factor: B) due to the influence of using carbon black (Example 1: carbon nanotubes having specific surface area of 1,000 m²/g; Example 6: carbon black having specific surface area of 600 m²/g) as compared to Example 1 (fill factor: A; energy conversion efficiency: A; durability: A).

In Comparative Example 1, durability was poor (durability: E), the catalytic performance of the conductive film decreased, and the fill factor was poor (fill factor: E) due to the influence of high polymeric compound content (residual amount) in the conductive film (Example 1: 20 mass %; Comparative Example 1: 60 mass %) and high water content in the conductive film (Example 1: 3 mass %; Comparative Example 1: 10 mass %) as compared to Example 1 (fill factor: A; energy conversion efficiency: A; durability: A).

In Comparative Example 2, a polymeric compound did not remain in the conductive film, dislocation occurred, and cell performance could not be evaluated.

The invention claimed is:

1. A conductive film comprising a carbon material, a polymeric compound, and alkali metal atoms, wherein
    content of the polymeric compound is not less than 5 mass % and not more than 40 mass %, and
    content of the alkali metal atoms is not less than 5.0 mass % and not more than 15.0 mass %.

2. The conductive film according to claim 1, wherein the carbon material has a specific surface area of not less than 100 $m^2/g$ and not more than 3,000 $m^2/g$.

3. The conductive film according to claim 1, wherein the carbon material is a fibrous carbon nanostructure.

4. The conductive film according to claim 1, wherein the polymeric compound includes at least one selected from the group consisting of styrene butadiene rubber, acrylonitrile butadiene rubber, acrylic rubber, and modified rubber of any thereof.

5. The conductive film according to claim 1, wherein the alkali metal atoms are sodium atoms.

6. An electrode comprising the conductive film according to claim 1.

7. A solar cell comprising the electrode according to claim 6.

8. A method of producing a conductive film comprising:
    a step (1) of applying a carbon dispersion liquid containing a carbon material, a water-soluble dispersant, a binder resin, and an aqueous solvent onto a base material and drying the carbon dispersion liquid to form a carbon film; and
    a step (2) of washing the carbon film obtained in step (1) with an alkaline liquid to at least partially remove the water-soluble dispersant from the carbon film.

9. The method of producing a conductive film according to claim 8, wherein the water-soluble dispersant is a water-soluble polymeric dispersant.

10. The method of producing a conductive film according to claim 8, wherein the alkaline liquid is an inorganic alkali solution.

11. The method of producing a conductive film according to claim 8, wherein the alkaline liquid has a pH of not lower than 7.5 and not higher than 9.

* * * * *